(12) United States Patent
Baek

(10) Patent No.: US 6,620,730 B2
(45) Date of Patent: Sep. 16, 2003

(54) SMART POWER DEVICE AND METHOD FOR FABRICATING THE SAME

(75) Inventor: Jong Hak Baek, Seoul (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 10/226,170

(22) Filed: Aug. 23, 2002

(65) Prior Publication Data

US 2002/0197860 A1 Dec. 26, 2002

Related U.S. Application Data

(62) Division of application No. 09/500,575, filed on Feb. 10, 2000, now Pat. No. 6,465,845.

(30) Foreign Application Priority Data

Mar. 17, 1999 (KR) .......................................... 1999-9016

(51) Int. Cl.[7] .............................................. H01L 21/44
(52) U.S. Cl. ...................................................... 438/659
(58) Field of Search ........................ 438/306; 257/343, 257/344, 336, 305, 659

(56) References Cited

U.S. PATENT DOCUMENTS 4,290,077 A  9/1981  Ronen
5,907,173 A * 5/1999  Kwon et al. ................. 257/336

* cited by examiner

Primary Examiner—David Nelms
Assistant Examiner—Thao Le
(74) Attorney, Agent, or Firm—Birch, Stewart, Kolasch & Birch, LLP

(57) ABSTRACT

A smart power device and method for fabricating the same is disclosed in which an impact ionization to a drain region is reduced thereby securing a wide SOA (Safe Operation Area) and improving current driving characteristics. Such a device includes a smart power device comprising: a second conduction type drift region formed in a first conduction type well region by having first, second and (optionally but preferably) third impurity regions corresponding to first, second, and third ion injections with first, second, and third ion injection energies and first, second, and third doses; a first conduction type Dwell region formed adjoining to the second conduction type drift region; a source region and a body contact region both formed in the first conductive type Dwell region; a drain region formed in the second conduction type drift region; an insulating structure formed on an entire surface; a gate electrode layer formed in the insulating structure; a field plate formed to one side of the gate electrode layer and over the second conduction type drift region; and a source electrode layer and a drain electrode layer in contact with the source region and the drain region, respectively.

20 Claims, 16 Drawing Sheets

[Potential Contour (@ VG=0V VD=170V)]

SMART POWER DEVICE AND METHOD FOR FABRICATING THE SAME

This application is a divisional of application Ser. No. 09/500,575, filed on Feb. 10, 2000, now U.S. Pat. No. 6,465,845 the entire contents of which are hereby incorporated by reference and for which priority is claimed under 35 U.S.C. §120; and this application claims priority of Application No. 9016/1999 filed in Korea on Mar. 17, 1999 under 35 U.S.C. §119.

BACKGROUND OF THE INVENTION

1. Field of the Invention

The present invention relates to a semiconductor device, and more particularly, to a smart power device and a method for fabricating the same, in which impact ionization to a drain region is reduced for securing a wide SOA (Safe Operation Area) and improving current driving characteristics.

2. Background of the Related Art

A power MOSFET generally has excellent switching speed, a low ON resistance and can have a low breakdown voltage of 300V and below in comparison to other semiconductor devices, which makes a high voltage lateral power MOSFET useful as a high power device for high device packing density applications. Other high power devices include DMOSFET (Double-diffused MOSFET), IGBT (Insulated Gate Bipolar Transistor), EDMOSFET (Extended Drain MOSFET), LDMOSFET (Lateral Double-Diffused MOSFET), and the like. The LDMOSFET has a variety of applications to circuits, such as an HSD (High Side Driver), an LSD (Low Side Driver) or an H-Bridge, and can be easily fabricated. However, it has disadvantages in that a threshold voltage is high due to a non-uniform doping concentration in a channel region of the LDMOSFET itself and breakdown occurs at a surface of a silicon substrate in a drift region in the vicinity of the channel. The EDMOSFET is a high voltage transistor developed recently to deal with those problems.

A related art smart power device will be explained with reference to the attached drawings. FIG. 1 illustrates a section of a related art EDMOSFET, and FIG. 2 illustrates a simulation graph showing an electric field distribution and an impact ionization occurrence extent of the related art EDMOSFET.

Referring to FIG. 1, the related art N channel EDMOSFET is provided with an n type drift region 2 (formed by one instance of ion injection) formed in a p type semiconductor substrate 1, a p type Dwell (or deep well) region 3 formed in the p-type substrate adjoining the n type drift region 2, a source region 5 and a body contact heavily doped p type impurity region 6 formed in the p type Dwell region 3, a drain region 4 formed in the n type drift region 2, insulating layers 11 formed on the surface of the substrate 1, a gate electrode 7 formed in one of the insulating layers 11, a field plate 8 formed adjacent to (and aligning with) one side edge of the gate electrode 7 and over the n type drift region 2, source electrode 10 and a drain electrode 9 in contact with the source region 5 and the drain region 4, respectively.

The gate electrode 7 is formed such that the one side edge thereof is positioned at an interface of the n type drift region 2 and the p type Dwell region 3. The source region 5 and the drain region 4 are formed by doping with n type impurities, heavily, i.e., both are n+ type. The field plate 8 is formed over the one side edge of the gate electrode 7 and the n-type drift region 2 in a metal wiring formation. The field plate 8 disperses an electric field formed in the n type drift region 2 during operation, to obtain a higher breakdown voltage.

In the aforementioned related art smart power device, upon application of a voltage higher than Vt, which can form a channel to the gate electrode 7, an inversion layer is formed in the p type Dwell region 3. And, upon application of an operation voltage to the drain electrode 9, the n type drift region 2 is brought into a saturated depletion state, allowing electrons to move to the drain region 4. Thus, while the EDMOSFET is operative as a power device, the gate electrode 7 and the field plate 8 are brought into an equipotential state, causing the depletion region in the n type drift region 2 that disperses an electric field concentrated on an edge portion of the gate electrode 7, preventing an occurrence of breakdown at the edge portion of the gate electrode 7. And, the heavily doped p type impurity region 6 formed for use as a body contact sustains a ground voltage of the semiconductor substrate 1 through a body contact. The requirement for a high BV (breakdown voltage) performance for being operative as a smart power device can be met by an appropriate adjustment of the ion implantation dose to the n type drift region 2 and the resulting uniform distribution of an electric field utilizing a depletion region formed in the n type drift region 2 according to that dose.

FIGS. 2A and 2B illustrate three dimensional graphics of an electric field distribution and amount and position of impact ionization that occurs while the EDMOSFET is operative as a power device. It is known from the electric field distribution and amount and position of impact ionization occurrence at a gate voltage VG=9V and a drain voltage VD=75V that an impact ionization which heavily affects a secondary breakdown voltage occurs at a drain edge portion where the electric distribution is intense. That is, FIGS. 2A and 2B show that there is enough of an impact ionization to cause the secondary breakdown to occur at the drain edge portion.

The aforementioned related art smart power device causes the following problems during device operation due to existence of a parasitic bipolar transistor inside of the smart power device.

Upon application of a voltage to the drain, an electron-hole pair is formed by an impact ionization from the electric field at the drain edge. This causes an $I_{hole}$ current to flow, which turns on a parasitic bipolar transistor that causes the secondary breakdown if there is a voltage difference greater than 0.7V between the p type Dwell region and the n-type drift region. The secondary breakdown, that occurs because there is no reduction of the impact ionization to the drain region, causes a problem of unstable device operation due to there being no adequate SOA (Safe Operation Area).

SUMMARY OF THE INVENTION

Accordingly, the present invention is directed to a smart power device and a method for fabricating the same that substantially obviates one or more of the problems due to limitations and disadvantages of the related art.

An object of the present invention is to provide a smart power device and a method for fabricating the same, which can reduce an impact ionization to a drain region thereby securing an adequate SOA (Safe Operation Area) and improving current driving performance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

The invention, in part, provides a smart power device comprising: a second conduction type drift region formed in a first conduction type well region by having first, second and third impurity regions corresponding to first, second, and third ion injections with first, second, and third ion injection energies and first, second, and third doses; a first conduction type Dwell region formed adjoining to the second conduction type drift region; a source region and a body contact region both formed in the first conductive type Dwell region; a drain region formed in the second conduction type drift region; an insulating structure formed on an entire surface; a gate electrode layer formed in the insulating structure; a field plate formed to one side of the gate electrode layer and over the second conduction type drift region; and a source electrode layer and a drain electrode layer in contact with the source region and the drain region, respectively.

The invention also, in part, provides a method for fabricating a smart power device card, the method comprising: (a) forming a second conduction type drift region by, (a1) implanting a first does of second conductivity type impurity ions having a first energy into a first conduction type well region in a surface of the semiconductor substrate, to form a first ion injection region, (a2) implanting a second dose of second conductivity type impurity ions having a second energy into the first conduction type well region, to form a second ion injection region therein adjacent to the first ion injection region, and (a3) implanting a third dose of second conductivity type impurity ions having a third energy into the first conduction type well region, to form a third ion injection region adjacent to the second ion injection region; (b) forming a first conduction type Dwell region of a first conduction type in the semiconductor substrate adjoining the second conduction type drift region having the first, second and third ion injection regions; (c) forming a gate electrode layer such that a first side aligns with an interface between the second conduction type drift region and the first conduction type Dwell region; (d) implanting second conduction type impurity ions into the first conduction type Dwell region on a second side of the gate electrode layer and into the second conduction type drift region, to form a source region and a drain region, respectively; (e) implanting first conduction type impurity ions into a portion of the Dwell region adjacent to the source region to form a body contact region; and (f) forming a field plate adjacent over the first side of the gate electrode layer and over the second conduction type drift region.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 3A–3I illustrate sections showing the steps of a method for fabricating an EDMOSFET in accordance with a preferred embodiment of the present invention;

DETAILED DESCRIPTION OF THE PREFERRED EMBODIMENTS

Figure 1:
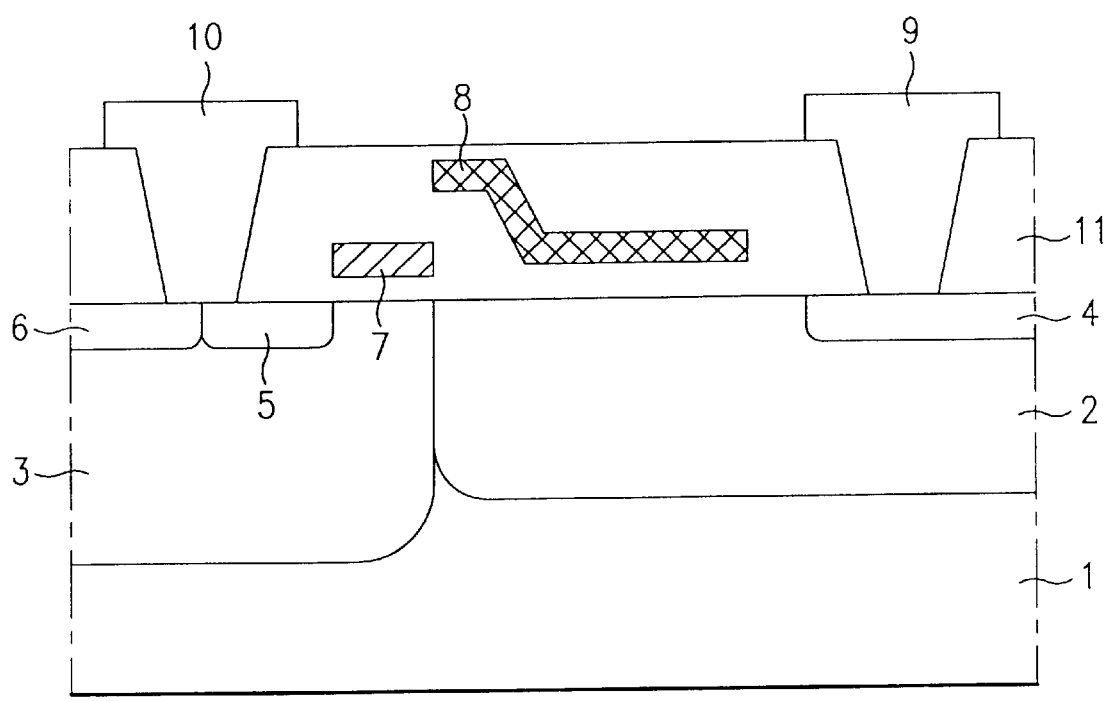
FIG. 1 illustrates a section of a related art EDMOSFET.
Figure 2B:
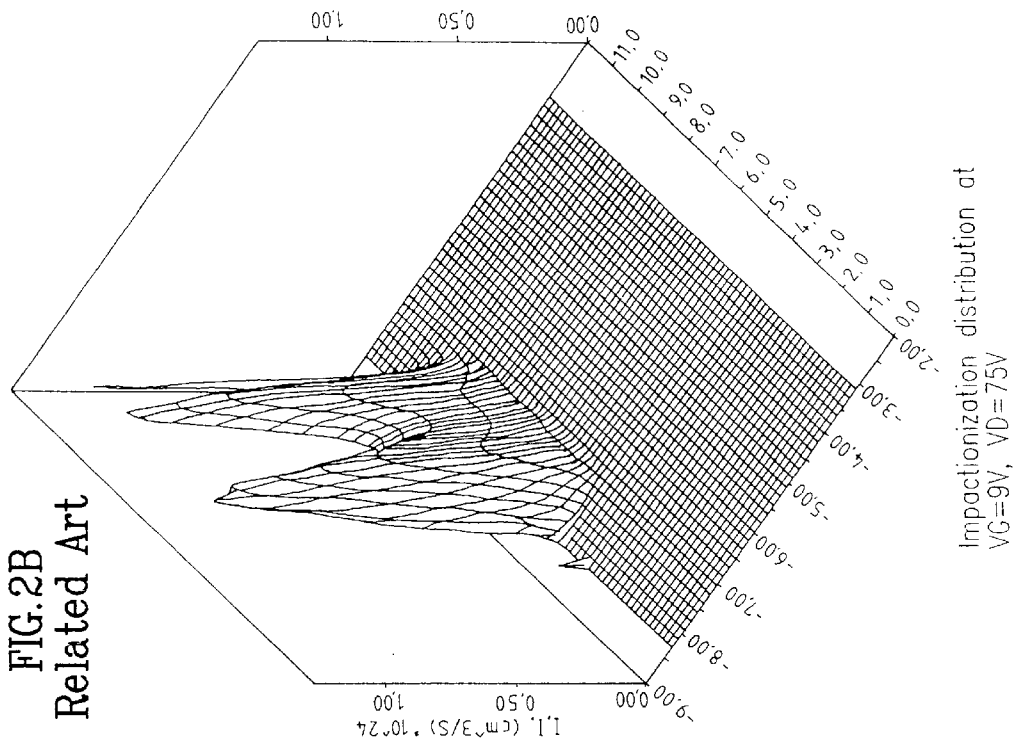
FIGS. 2A and 2B illustrate a simulation graphs of an electric field distribution and an extent of impact ionization occurrence of the related art EDMOSFET.
Figure 2A:
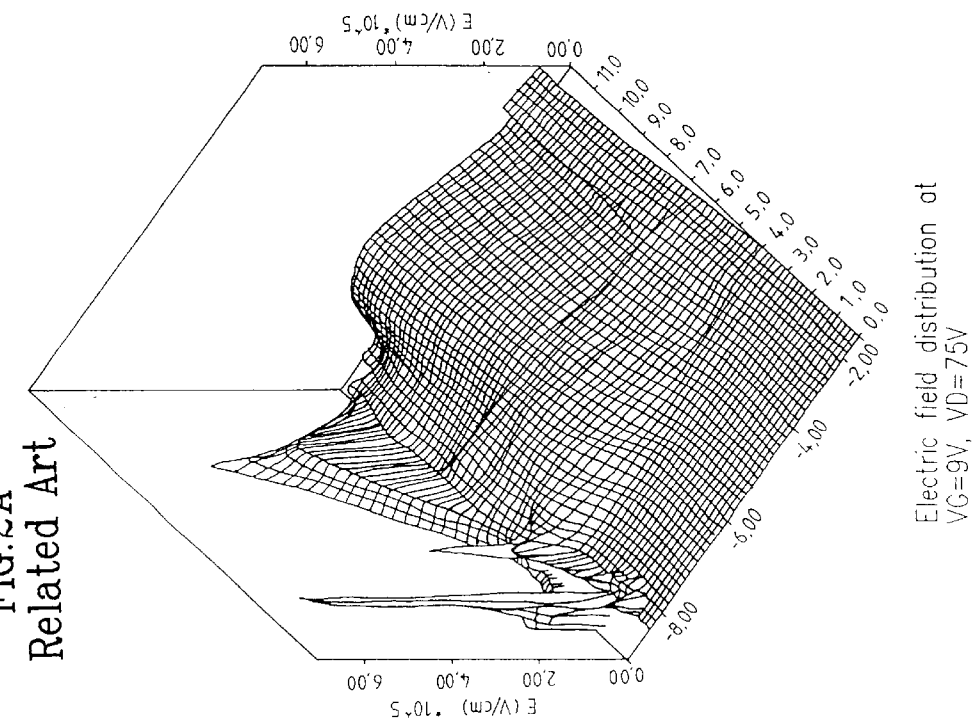

Reference will now be made in detail to the preferred embodiments of the present invention, examples of which are illustrated in the accompanying drawings. FIGS. 3A–3I illustrate sections showing the steps of a method for fabricating an EDMOSFET in accordance with a preferred embodiment of the present invention. The present invention suggests multiple instances of ion injections (at least two), with different doses, depending on a desired junction depth, to form an n type drift region in an EDMOSFET.

As shown in FIG. 3I, the EDMOSFET in accordance with a preferred embodiment of the present invention includes a p type Dwell region 34 adjoining an n type drift region 33 that are both formed in a p type well region 31 by at least first, and second, and optionally but preferably third, ion injections with first, second, and third ion injection energies and first, second, and third doses, a source region 36 and a body contact region 38 both formed in the p type Dwell region 34, a drain region 37 formed in the drift region 33, insulating layers 43 formed on an entire surface of the substrate 31, a gate electrode layer 35 formed inside one of the insulating layers 43, a field plate 39 formed adjacent to (and aligning with) one side edge of the gate electrode layer 35 and the n type drift region 33, a source electrode layer 41 and a drain electrode layer 40 in contact with the source region 36 and the drain region 37, respectively.

The gate electrode layer 35 is formed such that the one side edge thereof is positioned at an interface between the n type drift region 33 and the p type Dwell region 34. The source region 36 and the drain region 37 are formed by implanting n type impurity, heavily, i.e., both are n+ type. The field plate 39 is formed over the one side edge of the gate electrode layer 35 and the n type drift region 33 in a metal wiring formation. The field plate 39 disperses an electric field formed in the n type drift region 33 during operation, to obtain a higher breakdown voltage.

The n type drift region 33 may e.g., be formed by using only one kind of phosphorous, P, ions or two kinds both the P ions and arsenic, As, ions. The first, second, and third doses are within a range of $10^{11}$~$10^{13}$ atoms/cm$^2$, with the first dose>the second dose>the third dose. The ion injections are carried out with ion injection energies in an order of the first ion injection energy>the second ion injection energy>the third ion injection energy.

The method for fabricating an EDMOSFET in accordance with a preferred embodiment of the present invention will be explained.

Figure 3A:
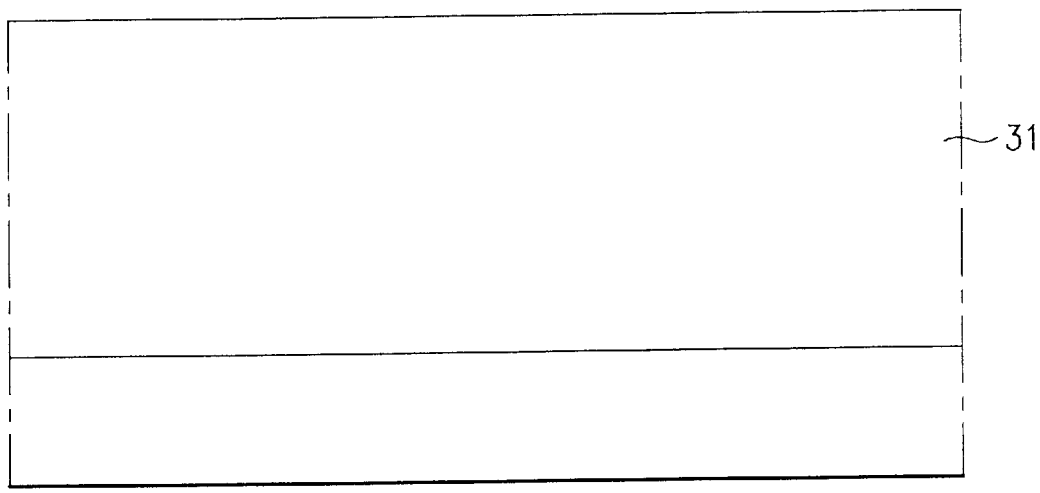
Figure 3B:
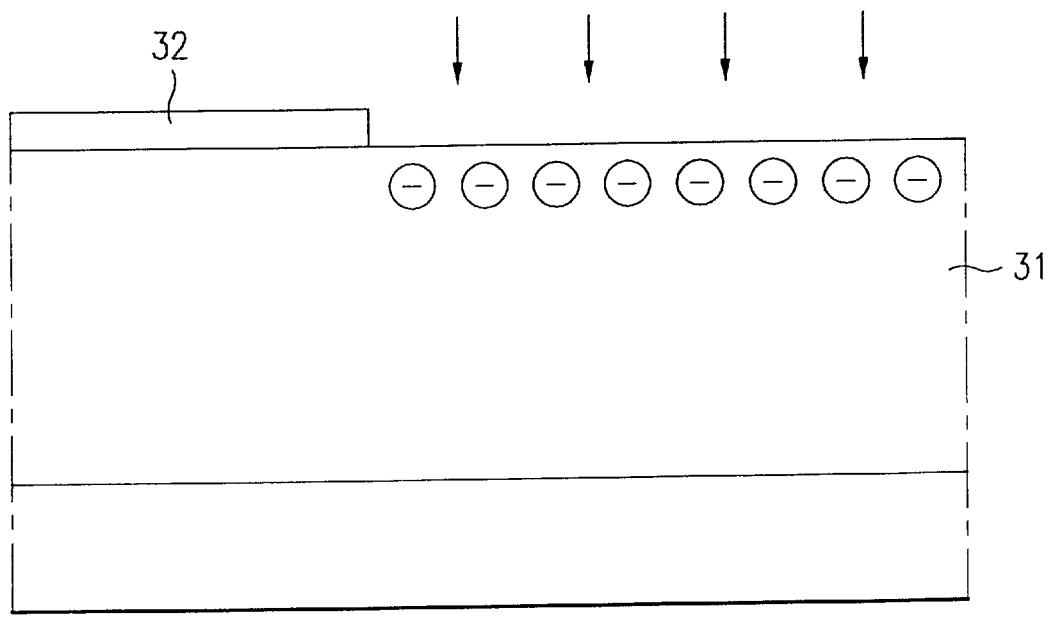

Referring to FIG. 3A, the method for fabricating an EDMOSFET in accordance with a preferred embodiment of the present invention starts with forming a p type well region 31 in a semiconductor substrate and a photoresist layer 32 is formed, selectively. The patterned photoresist layer 32 is used as a mask in injecting impurity ions into the exposed p type well region 31 with a first dose and a first energy, to produce a first ion injection region that forms a part of an n type drift region as in FIG. 3B.

Figure 3C:
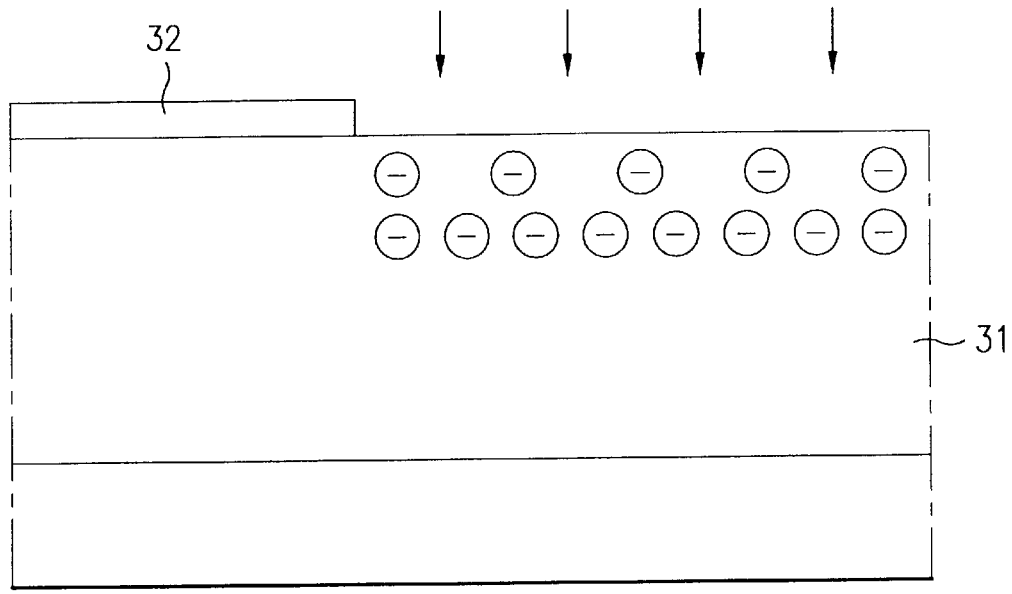
Figure 3D:
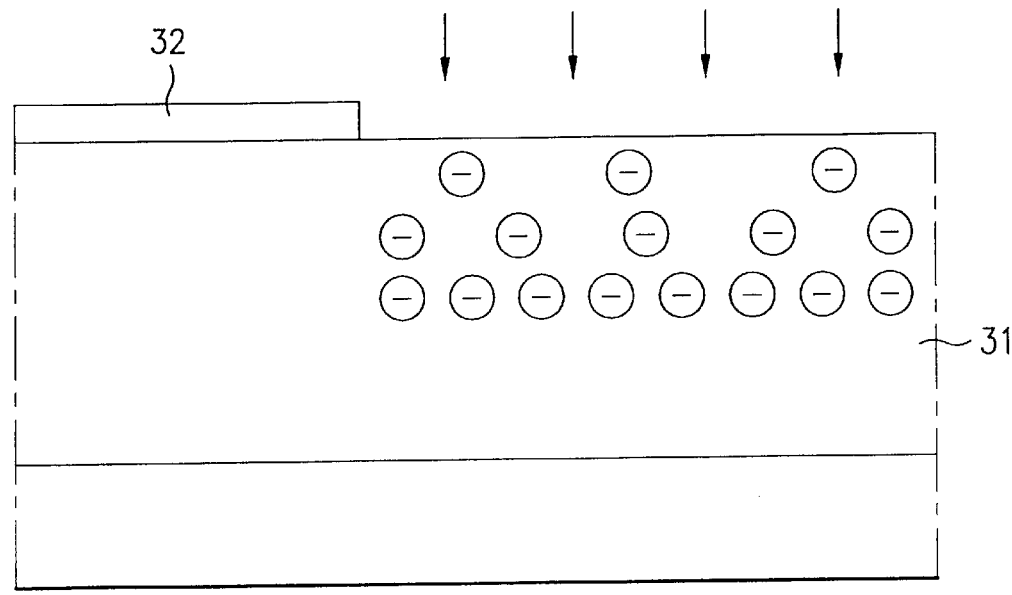

As shown in FIG. 3C, impurity ions are injected into the p type well region 31 with a different second dose and/or a different second energy, to produce a second ion injection region that forms a part of the n type drift region. As shown in FIG. 3D, impurity ions are optionally but preferably injected into the p type well region 31 with a different third dose and/or a different third energy, to produce a third ion injection region that forms a part of the n type drift region. The impurity ions used in the impurity ion injections for forming the n type drift region may, e.g., be solely P ions or a combination of P ions and As ions. The first, second, and third doses are within a range of $10^{11}$~$10^{13}$ atoms/cm$^2$, with the first dose>the second dose>the third dose. The ion injections are carried out with ion injection energies in an order of the first ion injection energy>the second ion injection energy>the third ion injection energy.

Figure 3E:
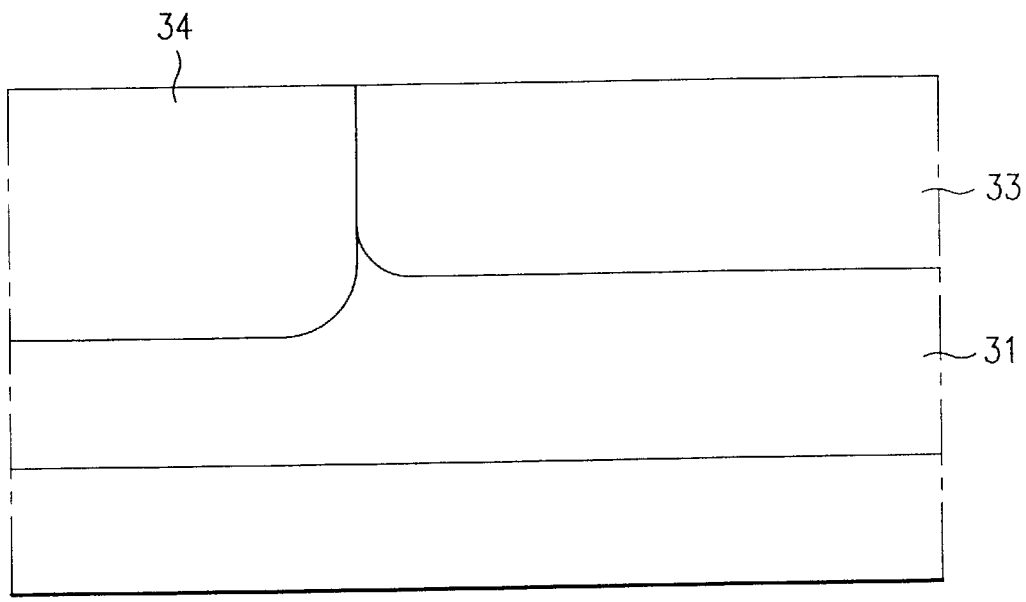
Figure 3F:
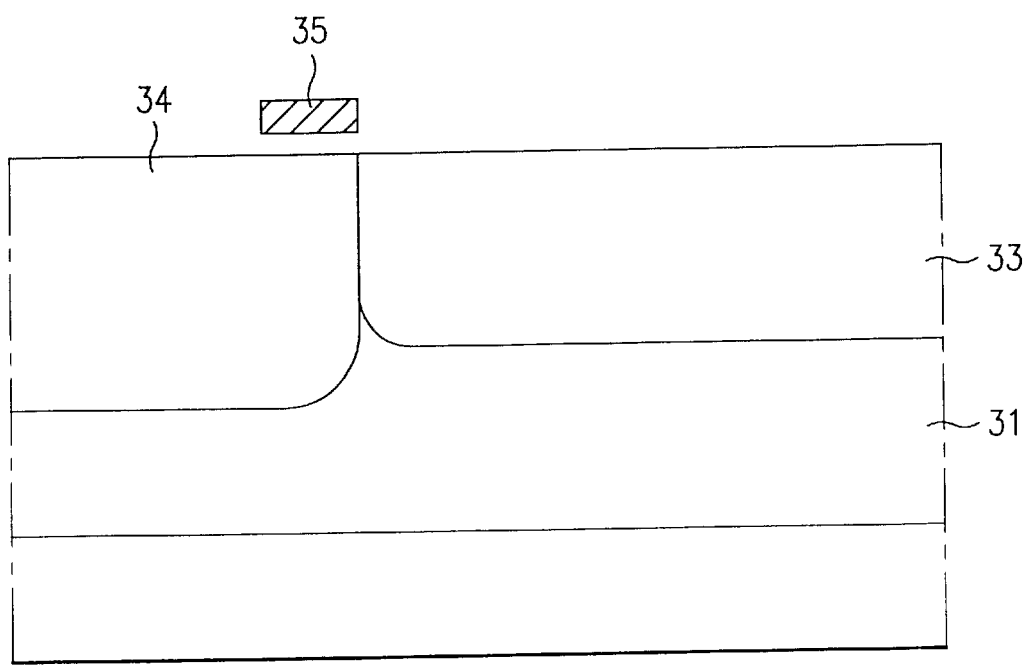

After forming the n type drift region 33 having the first, second and third ion injection regions, as shown in FIG. 3E, a p type Dwell region 34 is formed in the p type well region 31 and adjacent to the n type drift region 33. Then, as shown in FIG. 3F, a gate electrode layer 35 is formed (e.g., via the use of insulation layering and patterning (not shown) that ultimately forms a part of the structure layers 43) such that one side of the gate electrode layer 35 is positioned at an interface between the n type drift region 33 and the p type Dwell region 34.

Figure 3G:
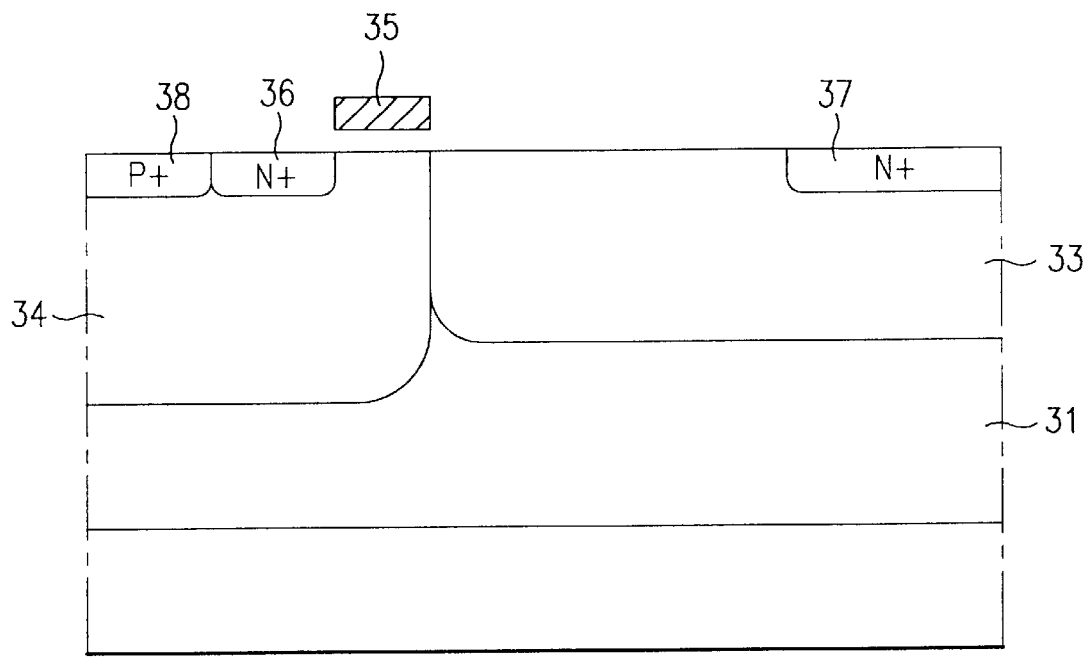

As shown in FIG. 3G, n type impurity ions are heavily injected into the p type Dwell region 34 on the other side of the gate electrode layer 35 (relative to the interface) and the n type drift region 33, to form a source region 36 and a drain region 37, respectively. P type impurity ions are injected into a portion adjoining to the source region 36 to form a p+ type body contact region 38.

Figure 3H:
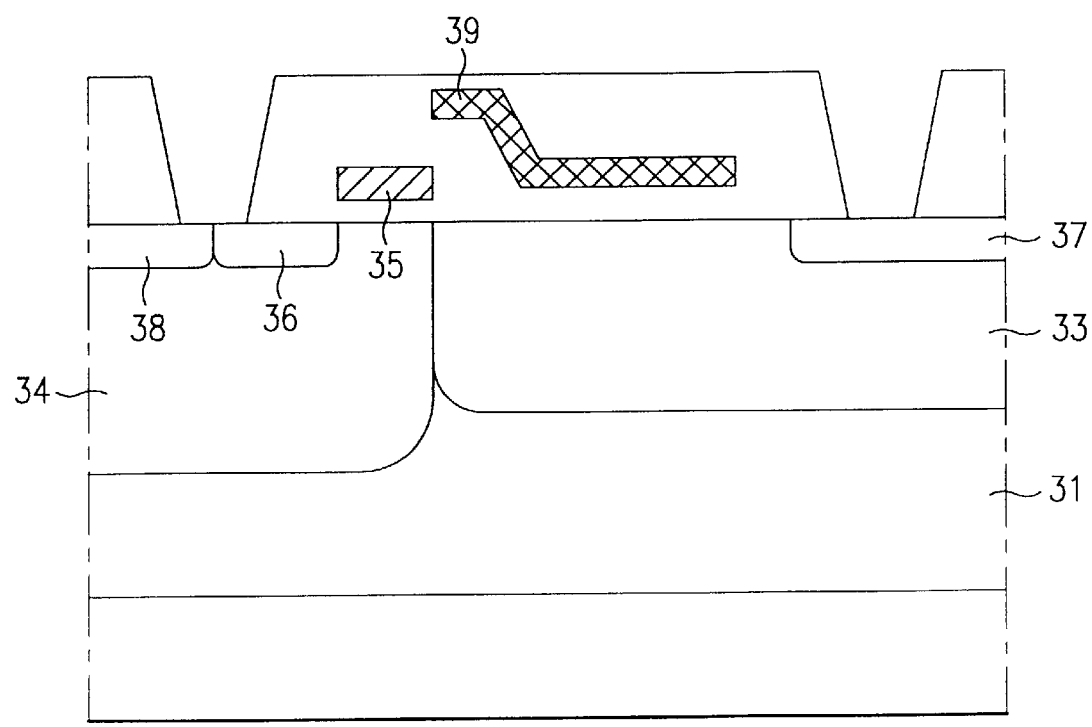
Figure 31:
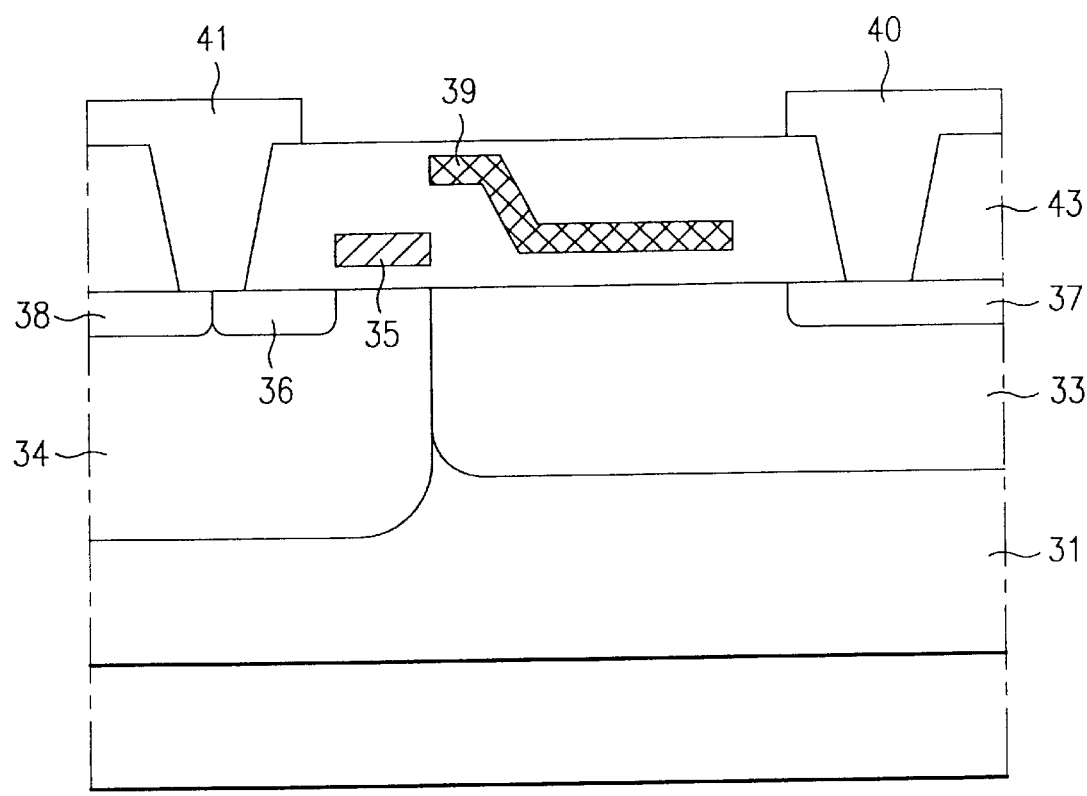

As shown in FIG. 3H, in order to obtain a higher breakdown voltage by dispersing an electric field that occurs in the n type drift region 33 during device operation, a field plate 39 is formed (e.g., via the use of insulation layering and patterning (not shown) that ultimately forms a part of the structure layers 43) adjacent to (and aligning with) one side edge of the gate electrode layer 35 and over the n type drift region 33 during metal wiring formation. And, contact holes are formed in the precursor structure to the structure layers 43 to expose a portion of a surface of the body contact region 38, the source region 36 and the drain region 37. Then, as shown in FIG. 3I, a source electrode layer 41 and a drain electrode layer 40 are formed so as to be in contact with the source region 36 and the drain region 37 through the contact holes, respectively.

In the aforementioned smart power device of the present invention, upon application of a voltage higher than Vt (which can form a channel to the gate electrode layer 35), an inversion layer is formed in the p type Dwell region 34. And, upon application of an operation voltage to the drain electrode 40, the n type drift region 33 is brought into a saturated depletion state, allowing electrons to move through the drain region 37. Thus, while the EDMOSFET of the present invention is operative as a power device, the gate electrode 35 and the field plate 39 are brought into an equipotential state, so that the depletion region in the n type drift region 33 disperses an electric field concentrated on an edge portion of the gate electrode 35, preventing an occurrence of breakdown at the edge portion of the gate electrode 35. The smart power device of the present invention has a saturated depletion layer formed in the n type drift region 33 during device operation, which endures over a certain level of operation voltage, and reduces a cause of the impact ionization occurred in the drain region 37, thereby achieving an adequate SOA.

Figure 4A:
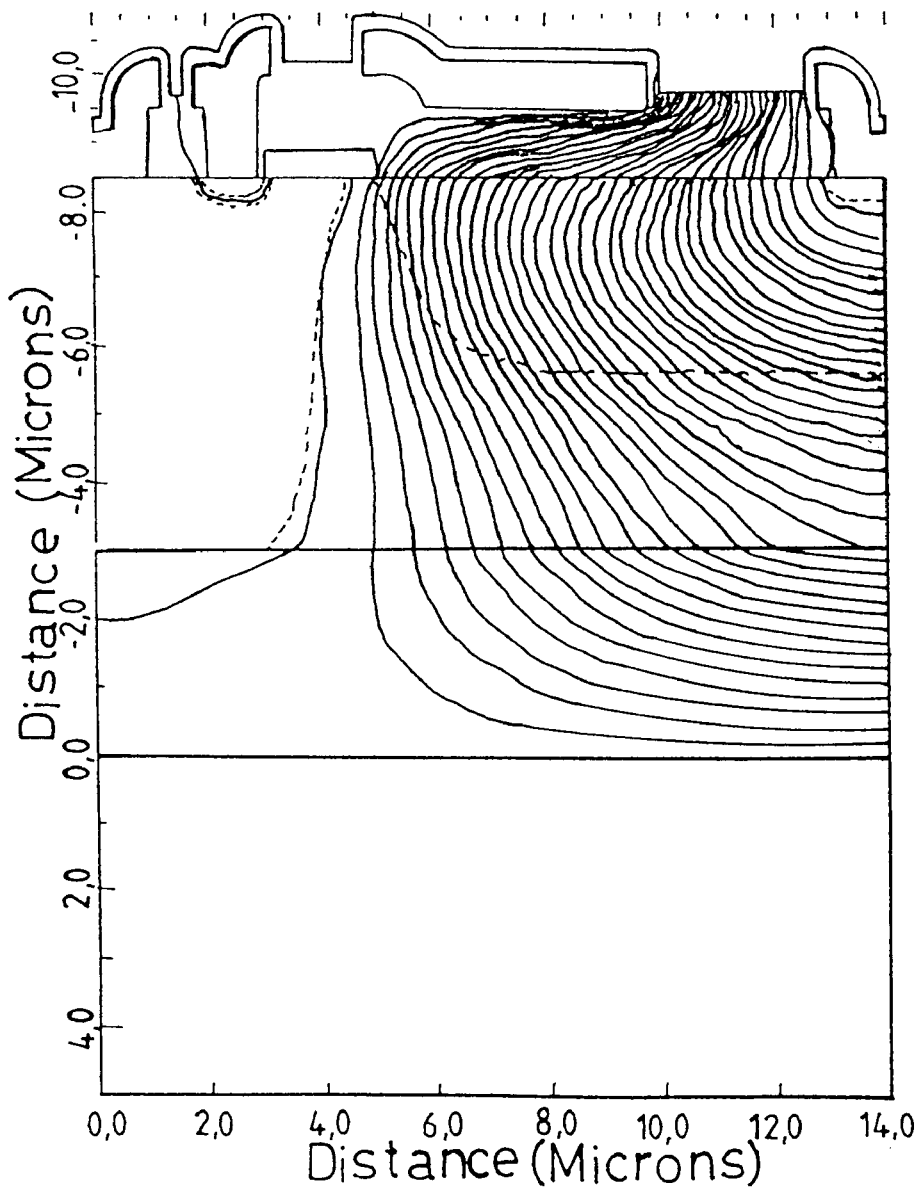
FIGS. 4A and 4B respectively illustrate simulation graphs showing a potential distribution and current vectors of the EDMOSFET of the present invention.
Figure 4B:
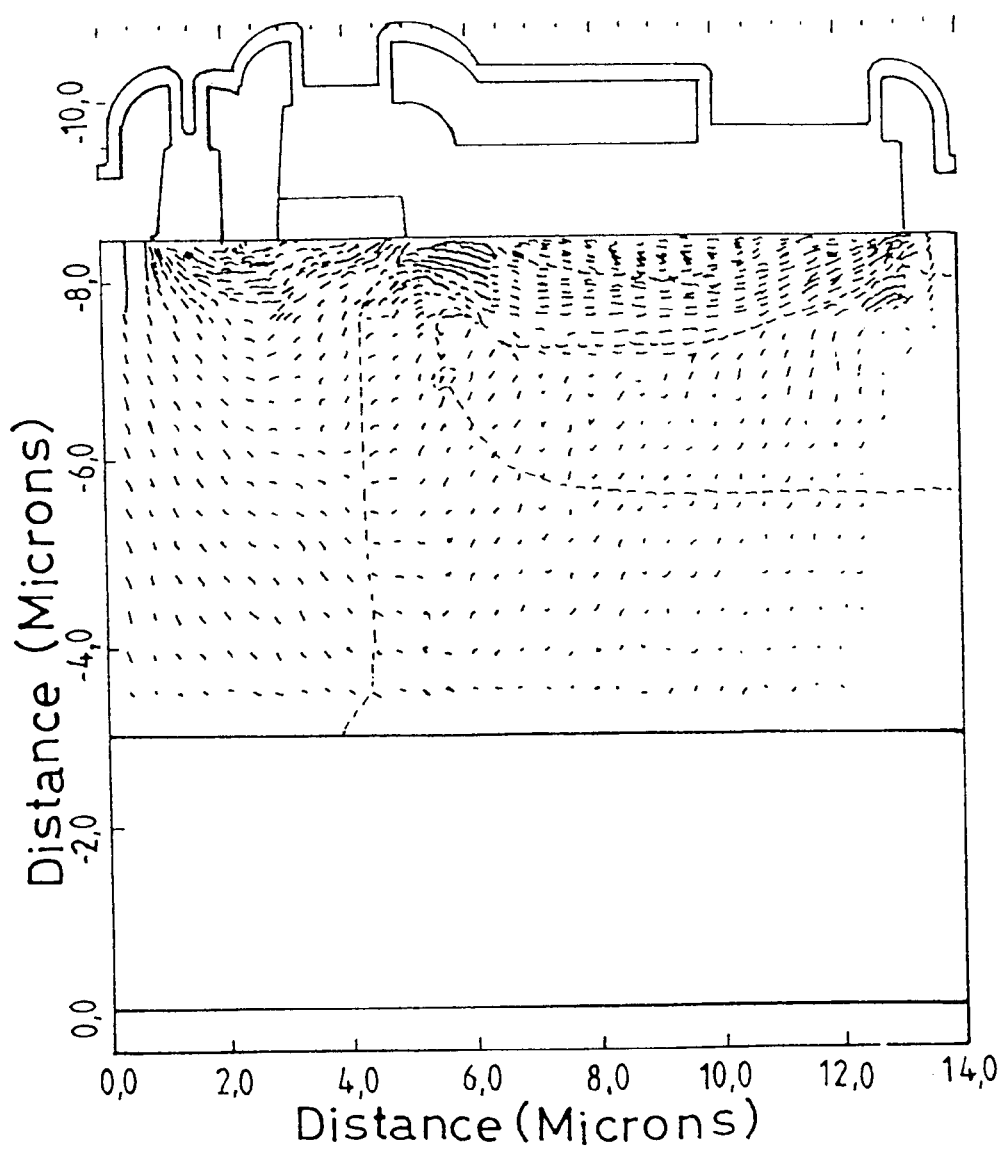
Figure 5:
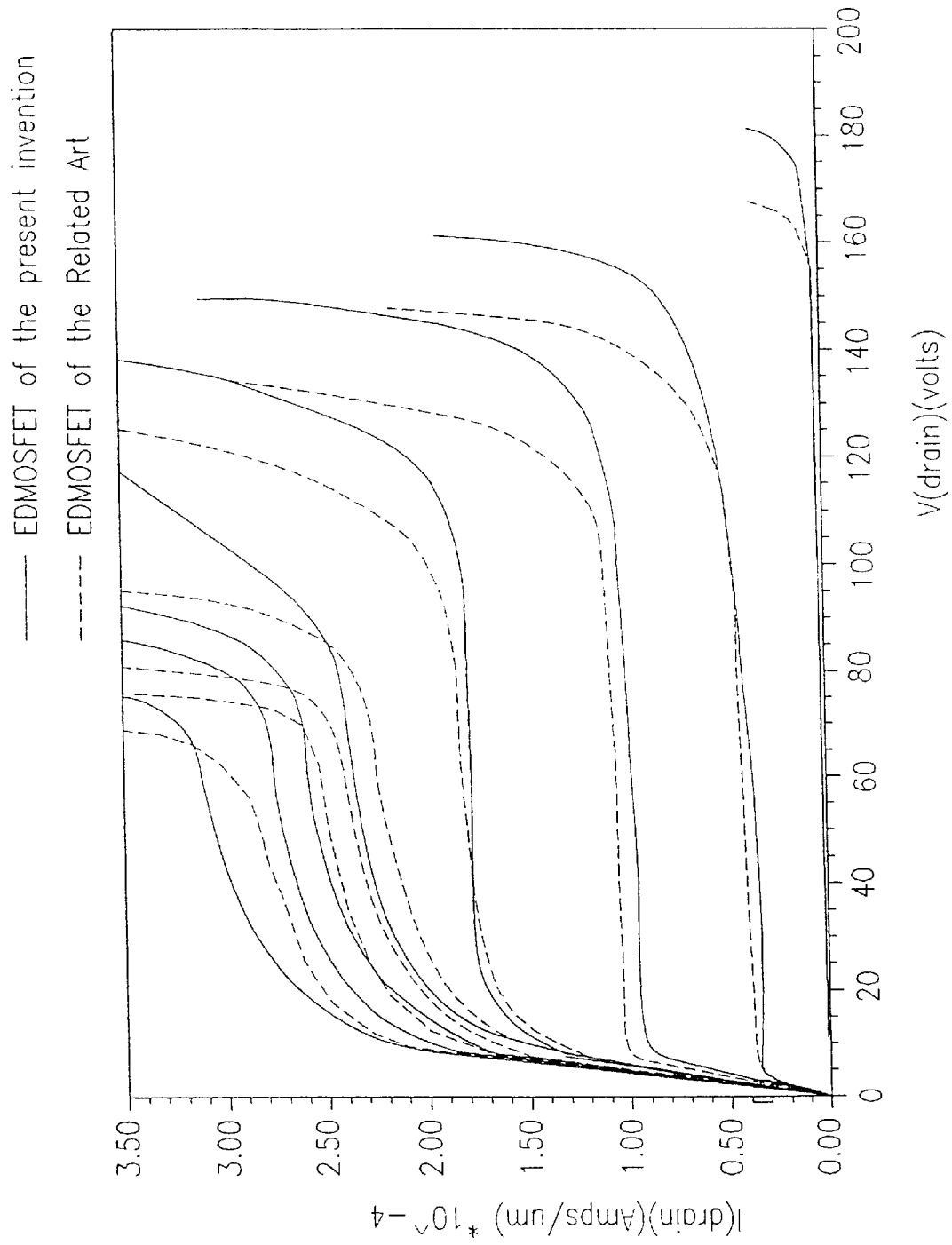
FIG. 5 illustrates a simulation graph showing I–V characteristics of the EDMOSFET of the present invention.

The operation characteristics of the smart power device of the present invention will be explained in detail. FIGS. 4A and 4B respectively illustrate simulation graphs showing a potential distribution and current vectors of the EDMOSFET of the present invention, and FIG. 5 illustrates a simulation graph showing I–V characteristics of the EDMOSFET of the present invention. FIGS. 4A and 4B are two dimensional graphics showing an electric distribution and amount and position of impact ionization occurrence of the EDMOSFET of the present invention when operative as a power device. That is, an electric field distribution at VG=0V and VD=170V in FIG. 4A and impact ionization at VG=9V and VD=120V in FIG. 4B are shown. FIG. 5, depicts IV characteristics indicating that the smart power device of the present invention, in which an impact ionization is reduced at a drain edge portion where the electric field distribution that affects the secondary breakdown voltage strongly is intense, has a higher secondary BV. And, FIG. 5 indicates that if the voltage to the gate electrode is at least 9V, more current flows.

Figure 6B:
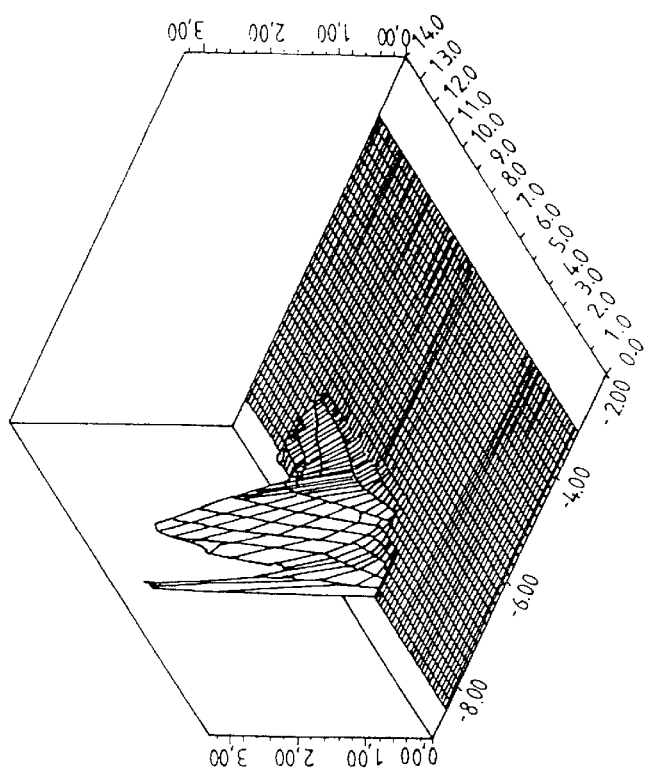
FIGS. 6A and 6B illustrate comparative simulation graphs showing an electric field distribution and an impact ionization occurrence extent of an EDMOSFET of the present invention.
Figure 6A:
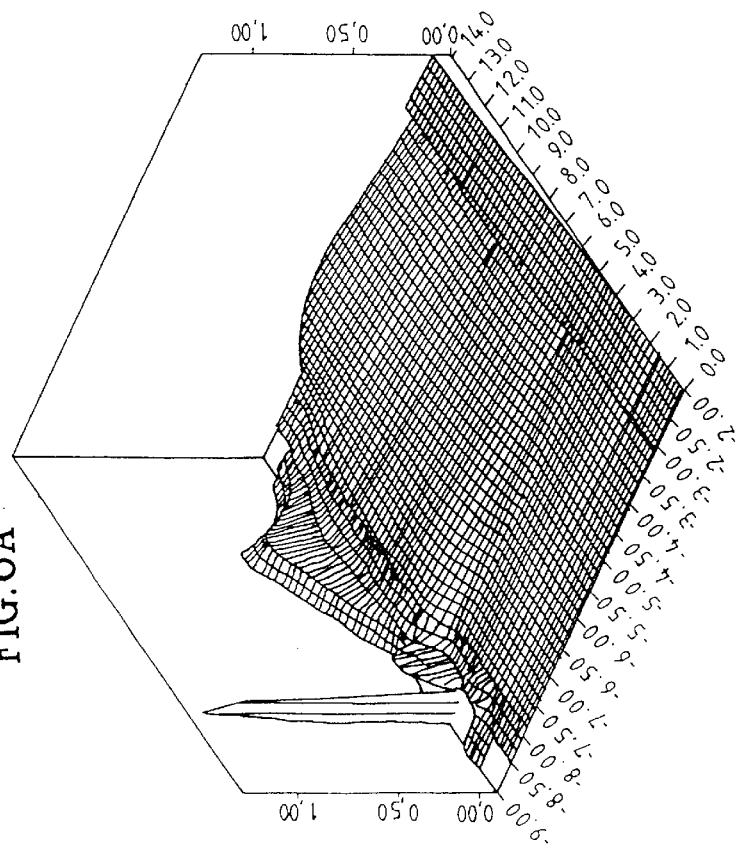
Figure 6D:
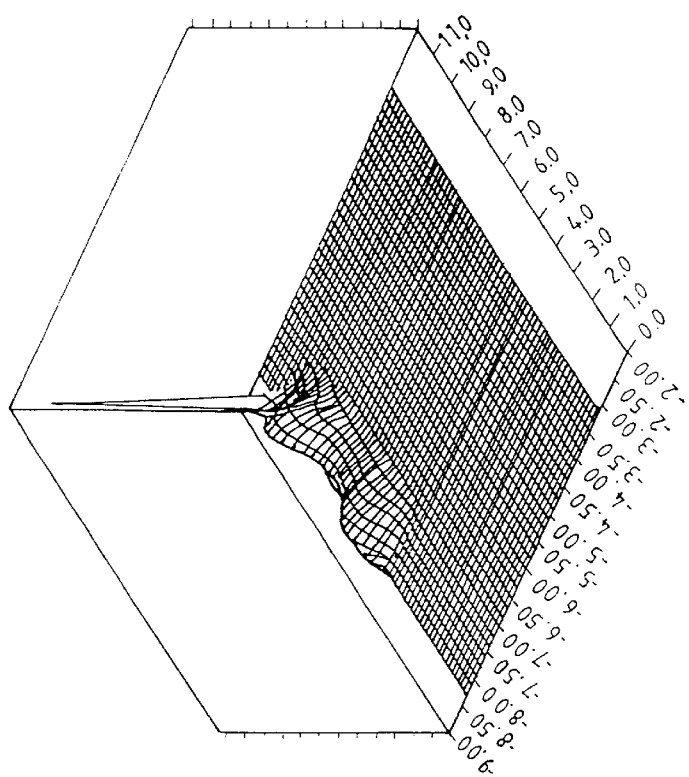
FIGS. 6C and 6D illustrate corresponding graphs for the related art.
Figure 6C:
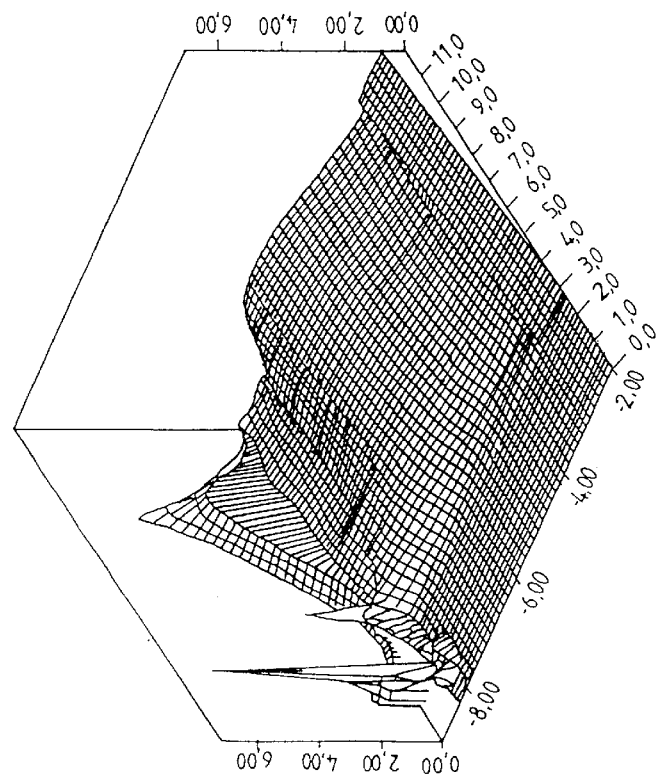
Figure 7A:
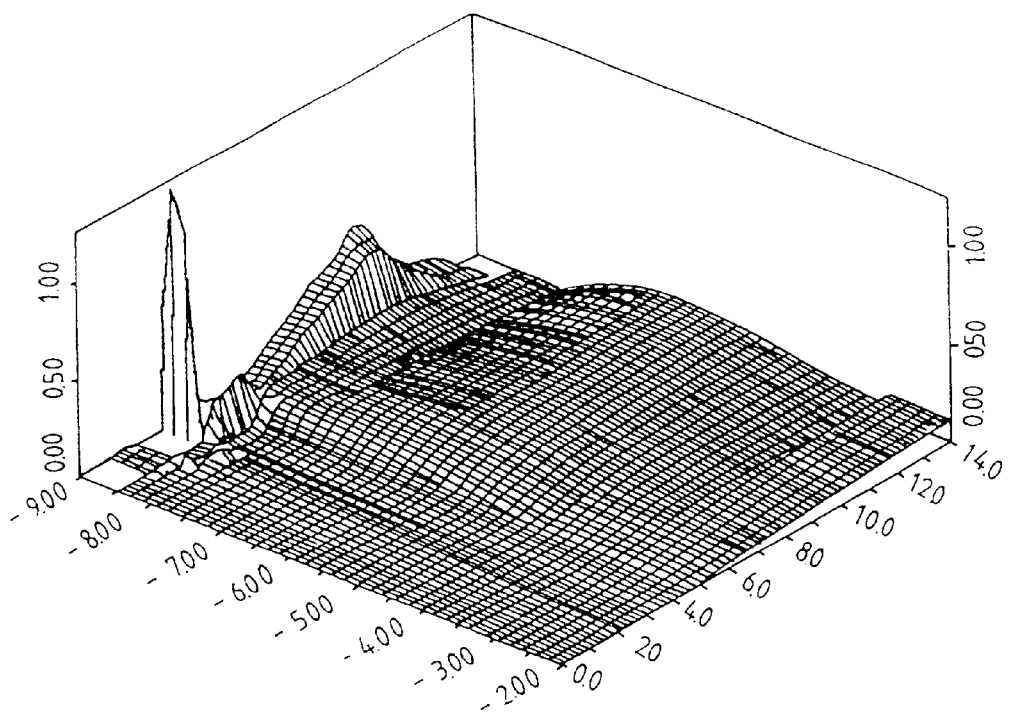
FIGS. 7A and 7B illustrate other comparative simulation graphs showing an electric field distribution and an impact ionization occurrence extent of an EDMOSFET of the present invention.
Figure 7B:
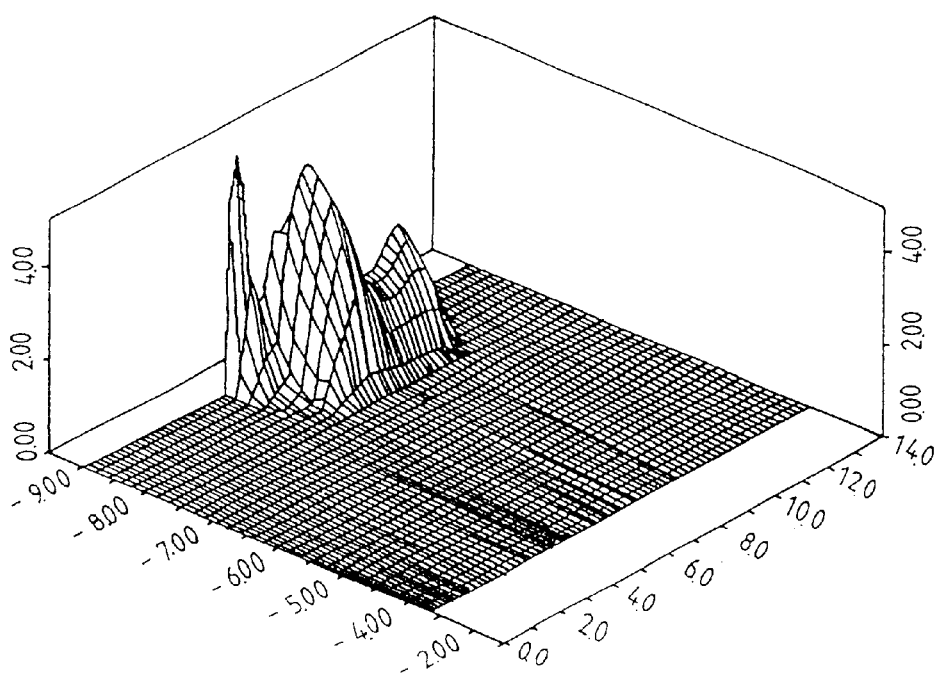
Figure 7C:
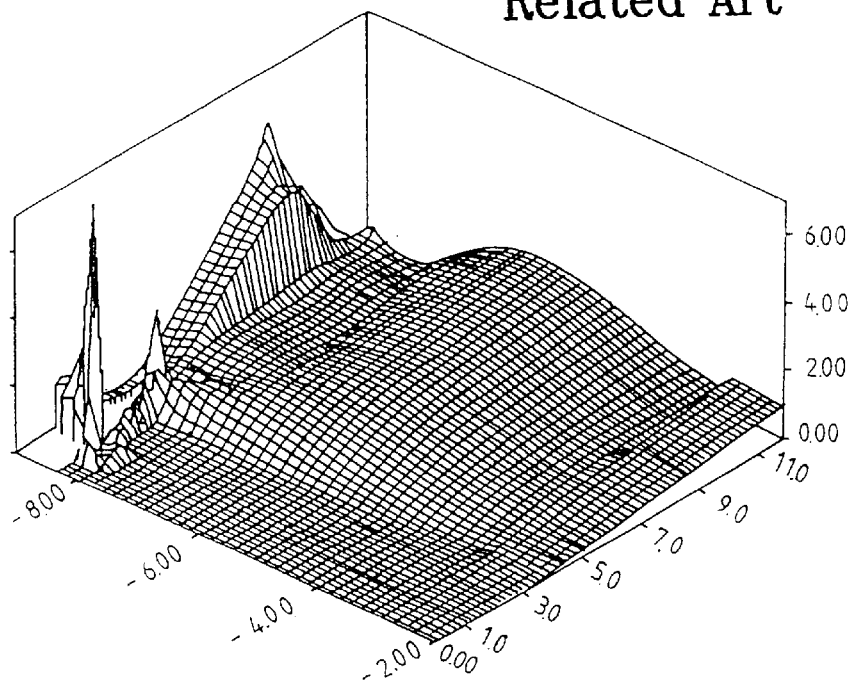
FIGS. 7C and 7D illustrate corresponding graphs for the related art.
Figure 7D:
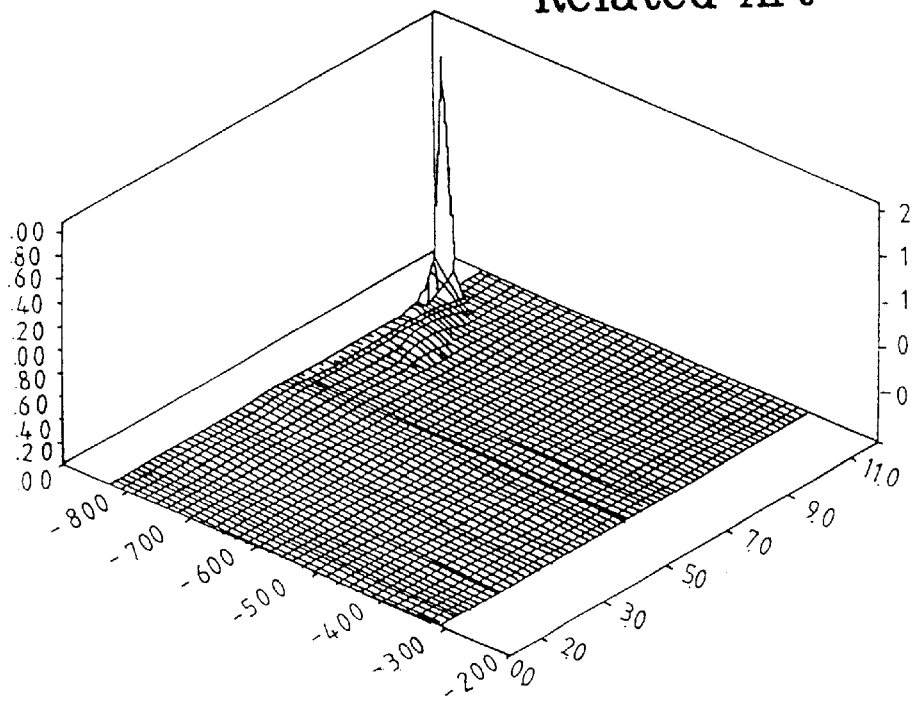
Figure 8A:
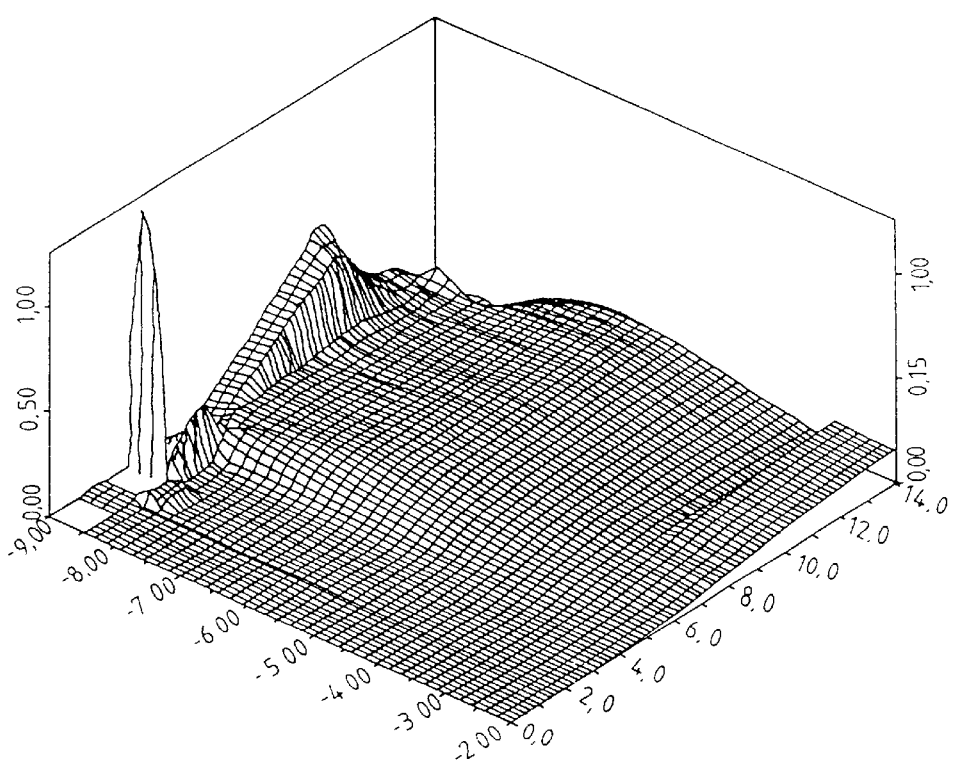
FIGS. 8A and 8B illustrate yet other comparative simulation graphs showing an electric field distribution and an impact ionization occurrence extent of an EDMOSFET of the present invention.
Figure 8B:
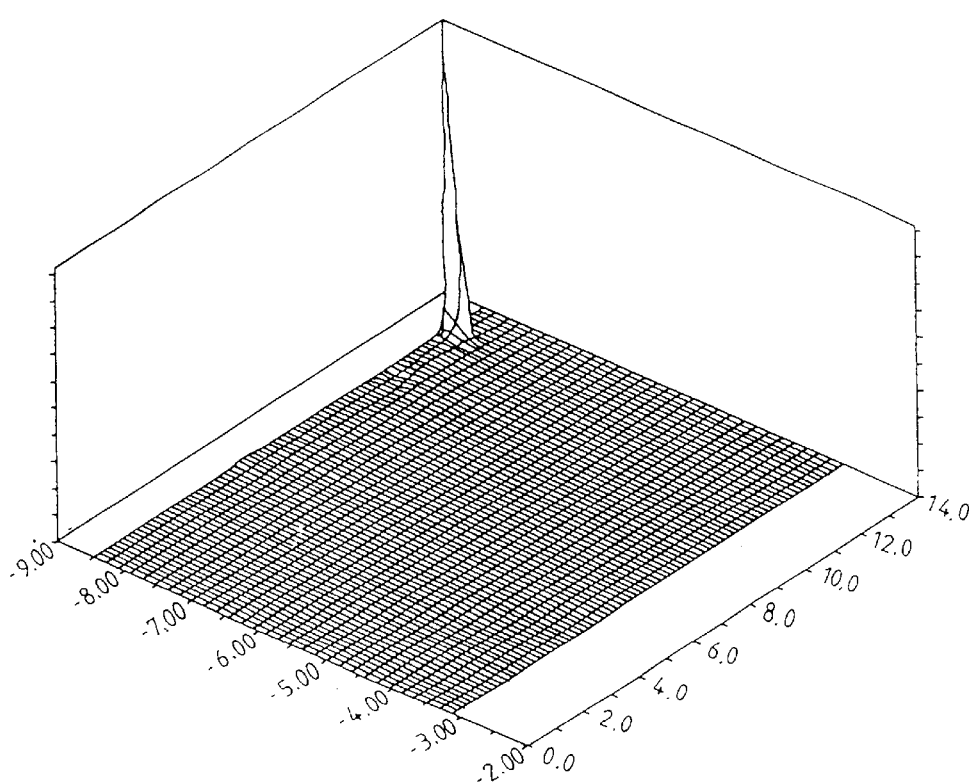
Figure 8C:
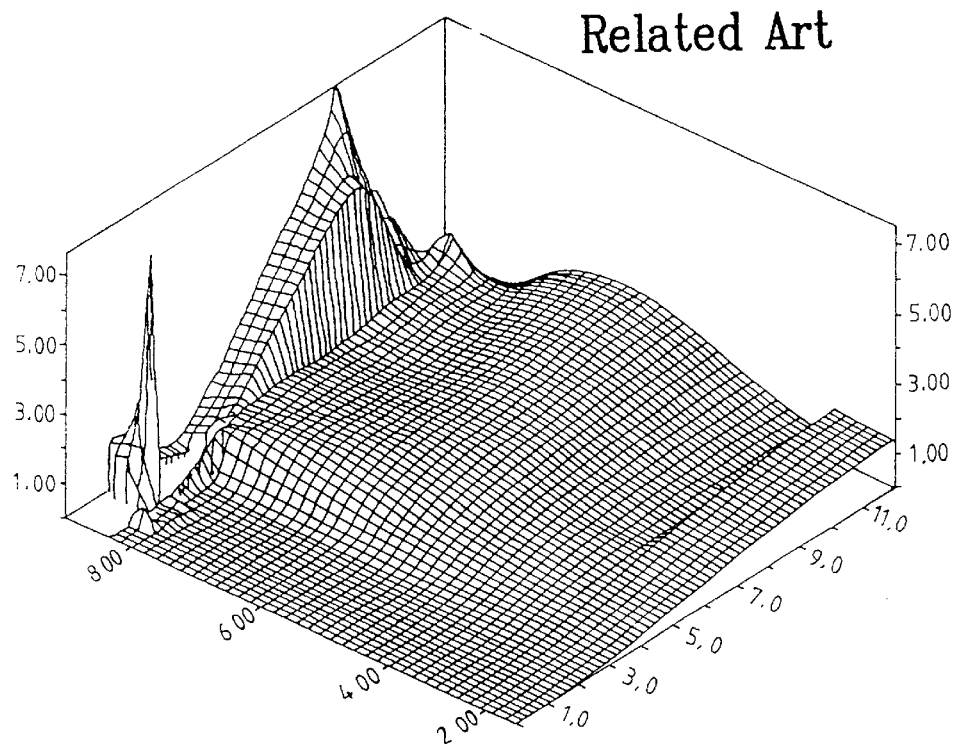
FIGS. 8C and 8D illustrate corresponding graphs for the related art.
Figure 8D:
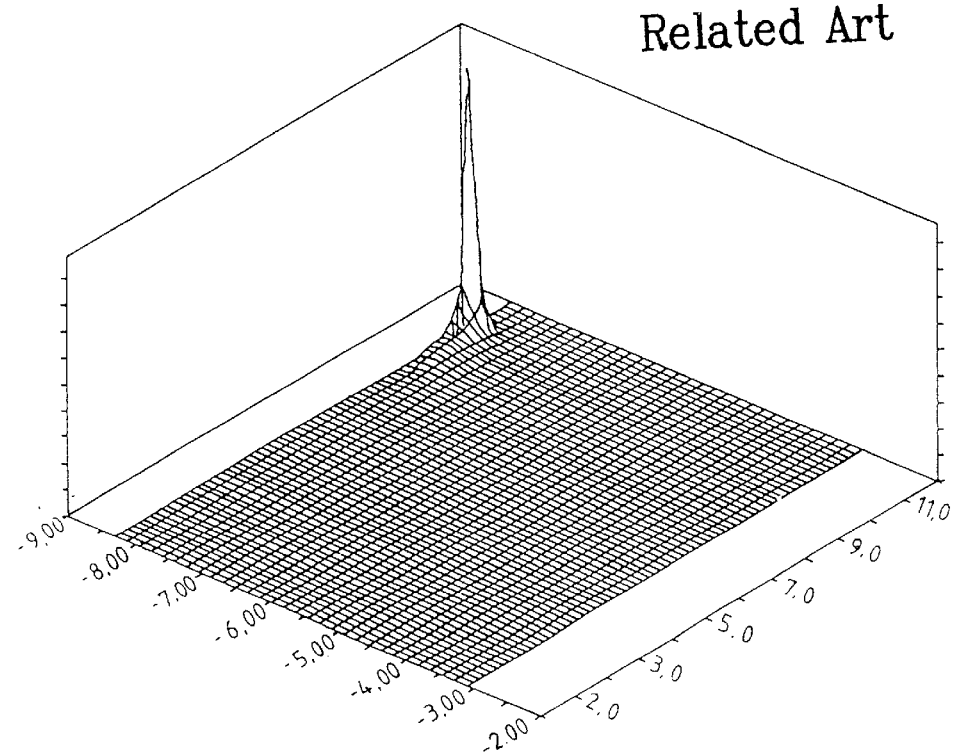

FIGS. 6A–6D, 7A–7D and 8A–8D are simulation graphs for comparing operation characteristics of smart power devices of the related art and the present invention as functions of VD (drain voltage). FIGS. 6A and 6B show operation characteristics of an embodiment of the present invention at VG=9V and VD=80V, wherefrom it can be seen that there is no occurrence of impact ionization enough to cause a secondary breakdown when VD is around 80V. However, in a case of the related art smart power device, it can be seen in FIGS. 6C and 6D that an impact ionization is reduced in the vicinity of the drain edge after an occurrence of the secondary breakdown. FIGS. 7A and 7B show operation characteristics of an embodiment of the present invention at VG=9V and VD=90V, wherefrom it can be seen that there is an increased impact ionization close to a critical field that almost causes a secondary breakdown when VD is around 90V. This contrasts with the results under the same conditions for the related art as depicted in FIGS. 7C and 7D. FIGS. 8A and 8B show operation characteristics of an embodiment of the present invention at VG=9V and VD=120V, wherefrom it can be seen that the secondary breakdown has already occurred when VD is around 120V. Results for similar conditions applied to the related art are depicted in FIGS. 8C and 8D.

As has been explained, the smart power device of the present invention can be made to have the following advantages by forming a drift region therein by multiple ion injections with varied doses and ion injection energies.

Breakdown characteristics of the smart power device according to the invention can be improved, thereby allowing a stable operation range of the device to be extended.

It will be apparent to those skilled in the art that various modifications and variations can be made in the smart power device and the method for fabricating the same of the present invention without departing from the spirit or scope of the invention. Thus, it is intended that the present invention cover the modifications and variations of this invention provided they come within the scope of the appended claims and their equivalents.

What is claimed:

1. A method for fabricating a smart power device card, the method comprising:
   (a) forming a second conduction type drift region by implanting sequentially first and second doses of second conductivity type impurity ions having respectively first and second energies into a first conduction type well region of a semiconductor substrate, to form first and second ion injection regions, respectively;
   (b) forming a first conduction type Dwell region in the semiconductor substrate adjoining the second conduction type drift region having the first and second ion injection regions;
   (c) forming a gate electrode layer such that a first side aligns with an interface between the second conduction type drift region and the first conduction type Dwell region;
   (d) implanting second conduction type impurity ions into the first conduction type Dwell region on a second side of the gate electrode layer and into the second conduction type drift region, to form a source region and a drain region, respectively;
   (e) implanting first conduction type impurity ions into a portion of the first conduction type Dwell region adjacent to the source region to form a body contact region; and
   (f) forming a field plate adjacent over the first side of the gate electrode layer and over the second conduction type drift region.

2. The method as claimed in claim 1, further comprising:
   (g) forming contact holes for exposing a portion of a surface of each of the body contact region, the source region and the drain region; and,
   (h) forming a source electrode layer and a drain electrode layer so as to be in contact with the source region and the drain region through the contact holes, respectively.

3. The method as claimed in claim 1, wherein the second conduction type drift region is implanted with P ions or P ions and As ions.

4. The method as claimed in claim 1, wherein the first conductive type is p type, and the second conductive type is n type.

5. The method as claimed in claim 1, wherein the step (a) includes implanting a third dose of second conductivity type impurity ions having a third energy into the first conduction type well region, to form a third ion injection region adjacent to the second ion injection region.

6. The method as claimed in claim 5, wherein the first, second, and third doses are within a range of $10^{11}$ to $10^{13}$ atoms/cm$^2$, with the first dose being greater than the second dose being greater than the third dose.

7. The method as claimed in claim 5, wherein the ion injections are carried out with ion injection energies in an order of the first ion injection energy being greater than the second ion injection energy being greater than the third ion injection energy.

8. The method as claimed in claim 1, wherein the first and second doses are within a range of $10^{11}$ to $10^{13}$ atoms/cm$^2$, with the first dose being grater than the second dose.

9. The method as claimed in claim 1, wherein the ion injections are carried out with ion injection energies in an order of the first ion injection energy being greater than the second ion injection energy.

10. A method of forming a semiconductor device, comprising:
    forming a second conduction type drift region in a first conduction type area, by sequentially injecting first and second doses of impurity ions into an entire upper surface of the second conduction type drift region;
    forming a first conduction type well region adjoining to the second conduction type drift region in the first conduction type area;
    forming a source region in the first conduction type well region;
    forming a drain region in the second conduction type drift region;
    forming a gate electrode layer on the first conduction type well region;
    forming a field plate on the second conduction type drift region; and
    forming source and drain electrodes in contact with the source region and drain region, respectively.

11. The method as claimed in claim 10, further comprising:
    forming an insulating structure on portions of the first conduction type well region and the second conduction type drift region, by encompassing the gate electrode layer and the field plate.

12. The method as claimed in claim 11, further comprising:
    forming a body contact region adjacent the source region in the first conduction type well region.

13. The method as claimed in claim 10, wherein the first and second doses contained in the second conduction type drift region are within a range of $10^{11}$ to $10^{13}$ atoms/cm$^2$ where the first dose is larger than the second dose.

14. The method as claimed in claim 13, wherein the entire upper surface of the second conduction type drift region contains a third dose of impurity ions injected therein, wherein the second dose is larger than the third dose.

15. The method as claimed in claim 14, wherein the third dose contained in the second conduction type drift region is within a range of $10^{11}$ to $10^{13}$ atoms/cm$^2$.

16. A method of forming a smart power device, comprising:
    forming a second conduction type drift region in a first conduction type well region, by sequentially injecting first and second doses of impurity ions by first and second ion injections with first and second ion injection energies into an entire upper surface of the second conduction type drift region;
    forming a first conduction type deep well region adjoining to the second conduction type drift region;
    forming a source region and a body contact region in the first conduction type deep well region;
    forming a drain region in the second conduction type drift region;
    forming an insulating structure on an entire surface;
    forming a gate electrode layer in the insulating structure;
    forming a field plate to one side of the gate electrode layer and over the second conduction type drift region; and
    forming a source electrode layer and a drain electrode layer in contact with the source region and the drain region, respectively.

17. The method as claimed in claim 16, wherein the first conduction type is p type, and the second conduction type is n type.

18. The method as claimed in claim 16, wherein the entire upper surface of the second conduction type drift region contains a third dose of impurity ions injected therein by a third ion injection with a third ion injection energy.

19. The method as claimed in claim 18, wherein the first, second and third doses contained in the second conduction type drift region are within a range of $10^{11}$ to $10^{13}$ atoms/cm$^2$, with the first dose being greater than the second dose being greater than the third dose.

20. The method as claimed in claim 18, wherein the first ion injection energy is larger than the second ion injection energy which is larger than the third ion injection energy.

* * * * *